(12) United States Patent
Feng et al.

(10) Patent No.: US 8,933,469 B2
(45) Date of Patent: Jan. 13, 2015

(54) HIGH-VOLTAGE LIGHT-EMITTING DEVICE

(71) Applicant: Formosa Epitaxy Incorporation, Taoyuan County (TW)

(72) Inventors: Hui-Ching Feng, Taoyuan County (TW); Chen-Hong Lee, Taoyuan County (TW); Wei-Kang Cheng, Taoyuan (TW); Shyi-Ming Pan, Taoyuan (TW)

(73) Assignee: Formosa Epitaxy Incorporation, Taoyuan County (TW)

( * ) Notice: Subject to any disclaimer, the term of this patent is extended or adjusted under 35 U.S.C. 154(b) by 75 days.

(21) Appl. No.: 13/655,534

(22) Filed: Oct. 19, 2012

(65) Prior Publication Data

US 2013/0099259 A1  Apr. 25, 2013

(30) Foreign Application Priority Data

Oct. 24, 2011  (TW) .............................. 100138435 A

(51) Int. Cl.
*H01L 29/18*  (2006.01)
*H01L 33/00*  (2010.01)

(52) U.S. Cl.
USPC .............................................. 257/88; 257/89

(58) Field of Classification Search
CPC .......................... H01L 25/0753; H01L 27/156
USPC ....................... 257/88, 89, E33.062, E33.072
See application file for complete search history.

(56) References Cited

U.S. PATENT DOCUMENTS

| | | | |
|---|---|---|---|
| 8,624,270 B2 * | 1/2014 | Park | 257/88 |
| 2010/0213488 A1 * | 8/2010 | Choi et al. | 257/98 |
| 2011/0049537 A1 * | 3/2011 | Lee et al. | 257/88 |

* cited by examiner

*Primary Examiner* — Hung Vu
(74) *Attorney, Agent, or Firm* — Rosenberg, Klein & Lee

(57) ABSTRACT

The present invention relates to a high-voltage light-emitting device suitable for light-emitting diode chip array module. The device comprises a set of light emitting diode chips, about 18~25 chips, deposited on a substrate by using a non-matrix arrangement. Through the adjustments, the high-voltage light-emitting device of the present invention has optimized luminous efficiency.

9 Claims, 5 Drawing Sheets

HIGH-VOLTAGE LIGHT-EMITTING DEVICE

FIELD OF THE INVENTION

This invention relates to a light-emitting device, especially to a high-voltage light-emitting device having light-emitting diode chip interleaved arrangement therein.

BACKGROUND OF THE INVENTION

Due to the recent gradual decrease in fossil energy, and consequently the growing demand for energy-saving products, the light-emitting diode (LED) technology has made significant progress.

Under conditions of instability of the oil price, many countries around the world have actively engaged in development of energy-saving products, and the application of light-emitting diodes in energy-saving bulbs is a product of this trend.

In addition, with the advancement of light-emitting diode technology, applications of white or other color (blue, for example) light-emitting diodes get more widespread.

As the light-emitting diode technology matures over time, there are more and more applicable areas. The applications of light-emitting diodes to lighting includes residential areas: wall lamps, nightlights (the earliest field for using light-emitting diode as light source due to low requirement for brightness) auxiliary lights, garden lights, reading lights; utility areas: emergency lights, hospital bed lights; business areas: spotlights, downlights, light bars; outdoor areas: building exteriors, solar lights; and light shows, etc.

In addition to advantages of light-emitting diodes such as low power consumption, mercury free, long life, and low carbon dioxide emissions, the environmental policy of governments around the world banning the use of mercury has also encouraged researchers to delve into R&D and application of white light-emitting diodes. While the global trend of environmental protection rises, the light-emitting diode regarded as a green light source is in line with global mainstream trends. As pointed out previously, it has been widely used in 3C product indicators and display devices; also with the increase in production yield of light-emitting diodes, unit manufacturing costs have been greatly reduced, therefore demand for light-emitting diodes keeps increasing.

As described above, the development of high-brightness light-emitting diodes has become the focus of research and development of companies around the world at this moment; however, current light-emitting diodes are still flawed in application design, so that it is hard for the luminous efficiency to be optimal.

In practical applications, light-emitting diodes are often combined as light-emitting diode array modules, which arrange a large number of light-emitting diode chips on the substrate and obtain a better light-emitting effect by taking advantage of quantity. However, such a way of arranging light-emitting diode chips, in addition to problems of cooling that occur most frequently, how to further enhance the light-output efficiency is the subject that we should face and think about in this field.

In the prior technologies, as shown in FIG. 1, light-emitting diode chips are arranged side by side on a large substrate, and connected to one another by wire bonding to form a light-emitting matrix. FIG. 1 includes a substrate 10 and a plurality of light-emitting diode chips 20; the light-emitting diode chips 20 align neatly in the form of a matrix. In this arrangement, except the top surfaces of the light-emitting diode chips 20 and two side walls of the chips at four corners, light emitting from the rest of side walls of the light-emitting diode chips 20 are mutually shielded by adjacent chip; as a result, light output from sides around the chip is undoubtedly a waste and lighting efficiency of the light-emitting matrix is low.

SUMMARY

Therefore, the object of the present invention is providing a high-voltage light-emitting device comprising a plurality of light-emitting diode chips wherein the light-emitting diode chips have a larger light-output area and the luminous efficiency of the high-voltage light emitting device is enhanced.

The further object of the present invention is providing a high-voltage light-emitting device comprising: a substrate; and a set of light-emitting diode chips located on the substrate and having a number of 18 to 25; wherein, the light-emitting diode chips have an interleaved or staggered arrangement, and are packaged to be a high-voltage light-emitting device.

DETAILED DESCRIPTION

Figure 2:
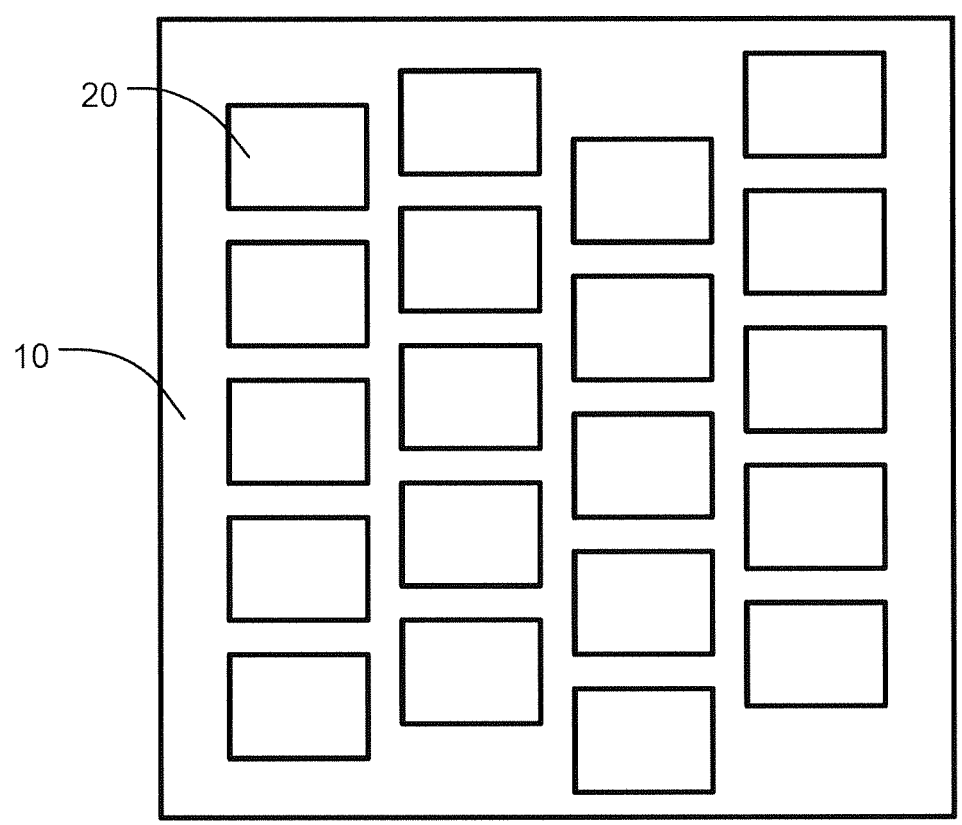
FIG. 2 shows a schematic diagram of the structure according to the first embodiment of the present invention.
Figure 3:
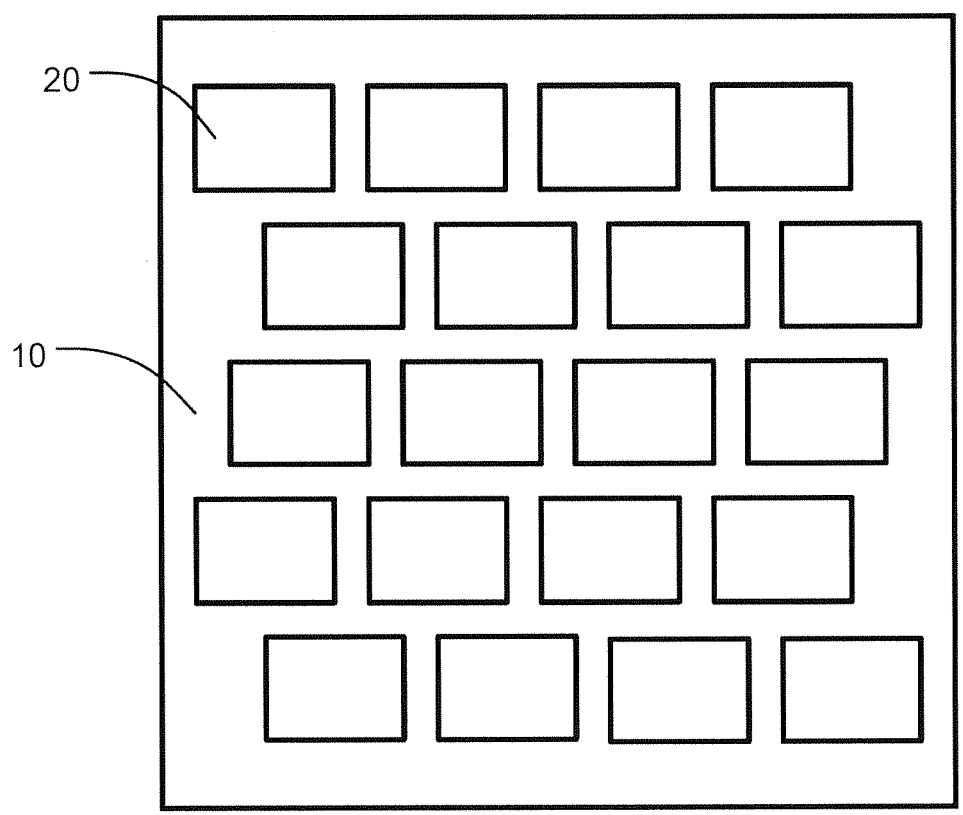
FIG. 3 shows a schematic diagram of the structure according to the second embodiment of the present invention.

First, refer to FIG. 2 and FIG. 3, which shows a schematic diagram of the structure according to the first and second embodiments of the present invention. As shown in the figure, the high-voltage light-emitting device in the present invention comprises a substrate 10 and a set of light-emitting diode chips 20.

Wherein, the set of light-emitting diode chips 20 are located on the substrate 10 and have a number of 18 to 25; in addition, the light-emitting diode chips 20 have an interleaved or staggered arrangement that each of the light-emitting diode chips 20 is not aligned with adjacent one, therefore the periphery of overall light-emitting diode chips 20 takes a form of staggered regular or irregular zigzag, as a non-matrix arrangement. Under this arrangement, in addition to light output from the top surfaces of the light-emitting diode chips 20 which occupied about 60% to 80% area of the substrate 10 can output light well, light output from the side walls of the light-emitting diode chips 20 can also be used.

Figure 1:
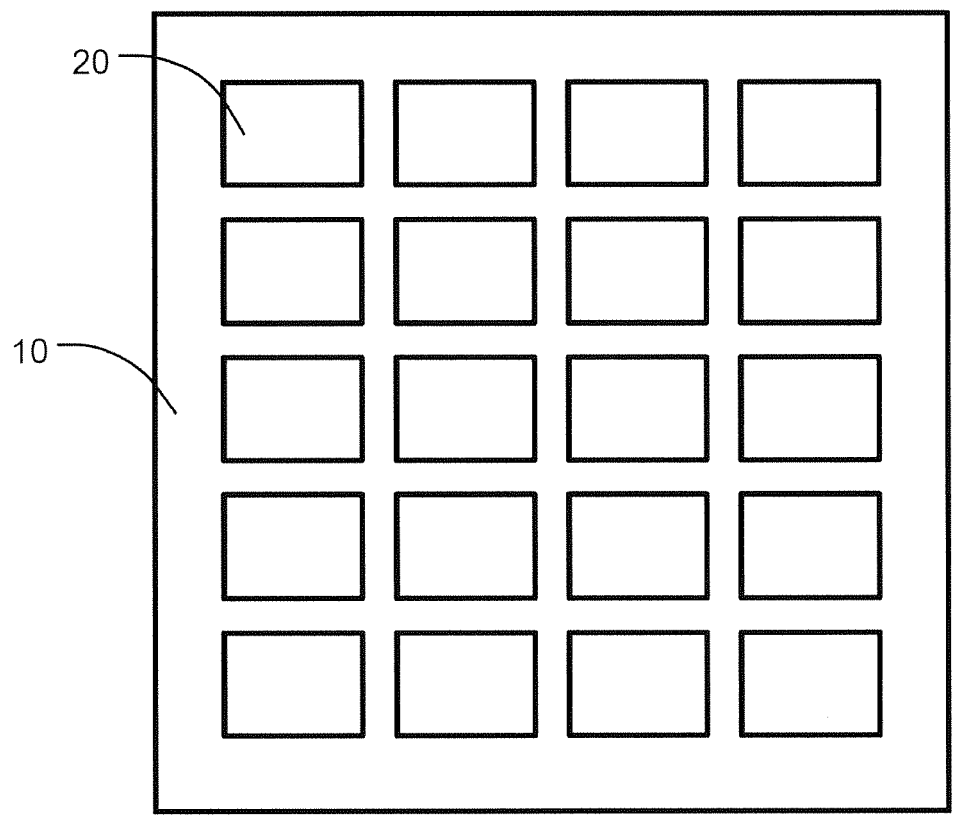
FIG. 1 shows a schematic diagram of the structure of the prior art.

Comparing FIG. 2 and FIG. 3 with FIG. 1, it is clearly understood that the present invention enhances the efficiency by adjusting the arrangement of the light-emitting diode chips 20 in order to achieve the best lighting efficiency for the same production costs.

Figure 4:
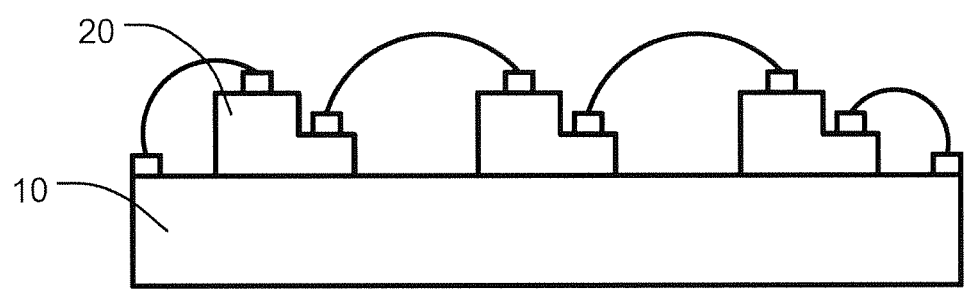
FIG. 4 shows a cross-section view of the structure according to the embodiment of the present invention.

In the present invention, the light-emitting diode chips 20 are connected in series. Refer to FIG. 4, which shows a cross-section view of the structure according to the embodiment of the present invention. As shown in the figure, the light-emitting diode chips 20 are spread on the substrate 10 and electrically connected to one another in series by bonding metal wires. Because the driving voltage of each of the light-emitting diode chips 20 is about 3.1 to 3.5 volts and the number of chips of a set is about 18 to 25, the total driving voltage of the light emitting device in the present invention is about 55.8 to 87.5 volts when the chips are connected in series, though it is suggested that the voltage had better keep within the range from 70 to 75 volts which is a more appropriate voltage range. And in addition to connect in series, light emitting chips 20 can also be connected in parallel or series-parallel depending on the driving voltage requirement of the light emitting device.

Figure 5:
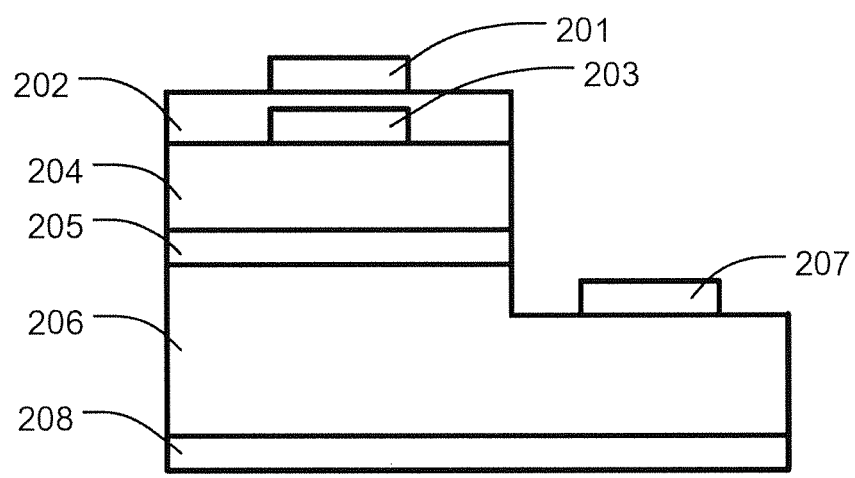
FIG. 5 shows a cross-section view of the light-emitting diode chip according to the third embodiment of the present invention.

In addition to the embodiment described above, the present invention also provides a light-output structure regarding to a light-emitting diode chip used in the high-voltage light emitting device. Please refer to FIG. 5, which shows a cross-section view of one of the light-emitting diode chips 20 according the third embodiment of the present invention. As shown in the figure, the light-emitting diode chip comprises a non-transparent P-type electrode 201; a transparent conductive layer 202; a current blocking layer 203; a P-type semiconductor layer 204; a light-emitting layer 205; an N-type electrode 207; an N-type semiconductor layer 206; and an optical reflection layer 208.

Wherein, the optical reflection layer 208 is located above the substrate 10, as well as at the bottom of the light-emitting diode chip; the N-type semiconductor layer 206 is located above the optical reflection layer 208; the N-type electrode 207 is located above the N-type semiconductor layer 206; the light-emitting layer 205 is also located above the N-type semiconductor layer 206, and not connected with the N-type electrode 207 directly; the P-type semiconductor layer 204 is located above the light-emitting layer 205; the transparent conductive layer 202 is located above the P-type semiconductor layer 204, wherein the current blocking layer 203 within the transparent conductive layer 202 is located above the P-type semiconductor layer 204; and the P-type electrode 201 is located above the transparent conductive layer 202.

Based on the structure of the light-emitting diode chip, the light generated by the light-emitting layer 205 toward the bottom of the chip can be reflected by the optical reflection layer 208 to the correct light-output direction, which is upward from the light-emitting diode chip.

Because the driving current is injected from the non-transparent P-type electrode 201 into the region below it, the most of light will be generated directly under the P-type electrode 201 which shielded the light and eventually resulting in reduction of light output efficiency. Therefore, the current blocking layer 203 in the present invention can be used to spread the current direction away from the electrode 201 and then the light emitting efficiency of the light-emitting diode chip can be improved. The manufacture method of this kind of structure uses chemical vapor deposition and etching to deposit insulators into the device structure for the purpose of blocking the shortest path, so as to make the current of the light-emitting diode chip travel other paths and thus enhance the brightness or light emitting efficiency of the light-emitting diode chip.

The foregoing description of one or more embodiments of the invention has been presented for the purposes of illustration and description. It is not intended to be exhaustive or to limit the invention to the precise form disclosed. Many modifications and variations are possible in light of the above teaching.

The invention claimed is:

1. A light-emitting device, comprising:
a substrate; and
a set of light-emitting diode chips, disposed on the substrate and having a number about 18 to 25 chips;
wherein the light-emitting diode chips have a mis-aligned arrangement, and the luminous area of the light-emitting diode chips is about 60% to 80% of the surface of the substrate, such that light outputted from side walls of the light-emitting diode chips used to enhance the lighting efficiency of the light-emitting device.

2. The light-emitting device of claim 1, wherein the driving voltage of each of the light-emitting diode chips is about 3.1 to 3.5V.

3. The light-emitting device of claim 1, wherein the light-emitting diode chips are connected to one another in series.

4. The light-emitting device of claim 1, wherein the total driving voltage of the light-emitting diode chips is 70-75V.

5. The light-emitting device of claim 1, wherein one of the light-emitting diode chips comprising a transparent conductive layer, disposed on the top of the light-emitting diode chip.

6. The light-emitting device of claim 5, wherein one the light-emitting diode chips further comprising a current blocking layer, disposed in the transparent conductive layer.

7. The light-emitting device of claim 1, wherein one of the light-emitting diode chips comprising an optical reflection layer disposed at the bottom of chip.

8. The light-emitting device of claim 1, wherein periphery of overall the set of light-emitting diode chips takes a form of staggered regular zigzag.

9. The light-emitting device of claim 1, wherein periphery of overall the set of light-emitting diode chips takes a form of staggered irregular zigzag.

* * * * *